(12) United States Patent
Bunkofske et al.

(10) Patent No.: US 6,678,569 B2
(45) Date of Patent: Jan. 13, 2004

(54) USER CONFIGURABLE MULTIVARIATE TIME SERIES REDUCTION TOOL CONTROL METHOD

(75) Inventors: Raymond J. Bunkofske, South Burlington, VT (US); John Z. Colt, Jr., Williston, VT (US); James J McGill, Fishkill, NY (US); Nancy T. Pascoe, South Burlington, VT (US); Maheswaran Surendra, Croton-on-Hudson, NY (US); Marc A. Taubenblatt, Pleasantville, NY (US); Asif Ghias, San Francisco, CA (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 10/013,070

(22) Filed: Nov. 6, 2001

(65) Prior Publication Data

US 2002/0062162 A1 May 23, 2002

Related U.S. Application Data

(62) Division of application No. 09/272,434, filed on Mar. 19, 1999, now Pat. No. 6,442,445.

(51) Int. Cl.[7] .............................................. G06F 19/00
(52) U.S. Cl. ......................................... 700/108; 700/51
(58) Field of Search ................................ 700/108, 109, 700/51, 28, 33, 34, 52, 67, 73, 79, 80, 121, 174, 175, 177; 702/179, 181, 182, 185; 216/60

(56) References Cited

U.S. PATENT DOCUMENTS

| | | | |
|---|---|---|---|
| 4,358,822 A | 11/1982 | Sanchez | 364/151 |
| 4,563,734 A | 1/1986 | Mori et al. | 364/157 |
| 5,329,443 A | 7/1994 | Bonaquist et al. | 364/153 |
| 5,347,460 A | 9/1994 | Gifford et al. | 364/468 |
| 5,408,405 A | 4/1995 | Mozumder et al. | 364/151 |
| 5,442,562 A | 8/1995 | Hopkins et al. | 700/108 |
| 5,479,340 A | 12/1995 | Fox et al. | 700/33 |
| 5,541,833 A | 7/1996 | Bristol et al. | 364/165 |
| 5,546,312 A | 8/1996 | Mozumder et al. | 364/468.03 |
| 5,598,329 A | 1/1997 | Niemann | 364/150 |
| 5,661,669 A | 8/1997 | Mozumder et al. | 364/552 |
| 5,693,440 A | 12/1997 | Barbur et al. | 430/30 |
| 5,740,033 A | 4/1998 | Wassick et al. | 364/149 |
| 5,751,582 A | 5/1998 | Saxena et al. | 364/468.16 |
| 6,153,115 A | * 11/2000 | Le et al. | 216/60 |

OTHER PUBLICATIONS

Spanos et al., "Real–Time Statistical Process Control Using Tool Data", IEEE Transaction on Semiconductor Manufacturing vol. 5, No. 4, Nov. 1992. pp. 308–318.

Lee et al., "RTSPC: A Software Utility for Real–Time SPC and Tool Data Analysis", IEEE Transaction Semiconductor Manufacturing vol. 8, No. 1, Feb. 1995.pp. 17–25.pp. 308–318.

Nomkos et al., "Multivariate SPC Charts for Monitoring Batch Processess", Technometrics, Feb. 1995, vol. 37, No. 1. pp. 41–59.

* cited by examiner

*Primary Examiner*—Leo Picard
*Assistant Examiner*—Steven R. Garland
(74) *Attorney, Agent, or Firm*—McGinn & Gibb, PLLC; Richard M. Kotulak, Esq.

(57) ABSTRACT

A method and structure for controlling a manufacturing tool includes measuring different manufacturing parameters of the tool, transforming a plurality of time series of the manufacturing parameters into intermediate variables based on restrictions and historical reference statistics, generating a surrogate variable based on the intermediate variables, if the surrogate variable exceeds a predetermined limit, identifying a first intermediate variable, of the intermediate variables, that caused the surrogate variable to exceed the predetermined limit and identifying a first manufacturing parameter associated with the first intermediate variable, and inhibiting further operation of the tool until the first manufacturing parameter has been modified to bring the surrogate value within the predetermined limit.

20 Claims, 6 Drawing Sheets

```
8    # Max. Time Series Gap.
3    # Min. Time Series Length
2000 # Max. Time Series Length
2    # Interpolation intervals (seconds)
0.0027 # false call rate (alpha)

begin load A_RF_POWER > v0
mean v0 A_RF_POWER_mean Hotelling Chartl vhpfilter v0 .1 > v1
stddev v1 A_RF_POWER_1_hp_sd Hotelling Chartl load A_N2_flow > v2
mean v2 A_N2_flow_mean Hotelling Chartl
stddev v2 A_N2_flow_sd Hotelling Chartl load A_CL_flow > v3
mean v3 A_CL_flow_mean Hotelling Chartl
stddev v3 A_CL_flow_sd Hotelling Chartl end
```

FIG.10

USER CONFIGURABLE MULTIVARIATE TIME SERIES REDUCTION TOOL CONTROL METHOD

CROSS-REFERENCE TO RELATED APPLICATIONS

This application is a division of U.S. application Ser. No. 09/272,434, now U.S. Pat. No. 6,442,445, filed Mar. 19, 1999

BACKGROUND OF THE INVENTION

1. Field of the Invention

The present invention generally relates to tool control system and solves the problem of mis-processing wafer lots/wafers by monitoring specific physical parameters of the tool set in real time. These parameters include any measurable quantifications relating to the process or tool, such as gas flow, temperature, pressure, power, etc.

2. Description of Related Art

A manufacturing line is generally controlled using three logistic functions: lots must be routed to the proper tool set; recipes for various process steps must be routed to an individual process tool; and wafer lots must be matched to tool and then to a recipe. Further, two control functions exist. The first control function is to track the logistics functions. The second is to control the process tool parameters (e.g., to decide when a tool malfunction or tool fault has occurred.)

The tool process parameters form a multivariate data set. The monitoring of such datasets has been the subject of many works, some of which are mentioned below. The set of tool data to be analyzed is very large and can be considered a three-dimensional dataset.

The first dimension of the three-dimensional dataset is the process parameter. Examples of process parameters include chamber pressure, temperature, gas flows, and RF power. The second dimension is time, with data for each process parameter being taken at regular times during wafer processing. The third dimension is the batching of data as defined by wafer.

Thus, the dataset consists of a time series for each process parameter, for each wafer processed. To reduce this dataset to a few indicators of tool performance (or health), i.e., a few surrogate variables, a data reduction scheme is necessary.

Nomikos (P. Nomikos and J. F. MacGregor, "Multivariate SPC Charts for Monitoring Batch Processes," *Technometrics*, vol. 37, No. 1, pp. 41–59, February 1995), incorporated herein by reference, discuss one such scheme by rearranging the three-dimensional dataset into a two-dimensional matrix and then performing a conventional principal components analysis (PCA). Spanos C. J. Spanos, H. F. Guo, A. Miller and J. Leville-Parrill, "Real-Time Statistical Process Control Using Tool Data," *IEEE Trans. on Semicond. Manuf,* vol. 5, No. 4, pp. 308–318, November 1992, incorporated herein by reference, describes a method to process time series (without regard to batching by wafer) using a time series filter. The Spanos article then describes using a Hotelling $T^2$ function to reduce groupings of n time series points to a single surrogate variable.

Lee (S. F. Lee, E. D. Boskin, H. C. Liu, E. H. Wen and C. J. Spanos, "RTSPC: A Software Utility for Real-Time SPC and Tool Data Analysis," *IEEE Trans. on Semicond. Manuf,* vol. 8, No. 1, pp. 17–25, February 1995), incorporated herein by reference, describes a second method to reduce the dataset by collapsing the time series for each wafer using the average value of the time series, or the length of the time series (i.e., the process step). U.S. Pat. No. 5,442,562, incorporated herein by reference, describes a general method of reducing a plurality of process intermediate process variables (such as principal components) to a single surrogate variable, determining which intermediate variable is outside a predetermined limit, determining which process variable is the primary contributor and then correcting that process variable automatically via a computer.

When a two-dimensional dataset is to be monitored, for example, tool parameters such as pressure, gas flow, or temperature vs. wafer identity are to be monitored, a statistic called the Hotelling Function ($T^2$) can be used (see for example Doganaksoy, (N. Doganaksoy, F. W. Faltin and W. T. Tucker (1991)), "Identification of Out of Control Quality Characteristics in a Multivariate Manufacturing Environment," *Comm. Statist.—Theory Meth.*, 20, 9, pp. 2775–2790), incorporated herein by reference, where:

$$T^2 = \frac{(n_{ref}n_{new})(n_{ref} - p)}{(n_{ref}n_{new}) + (n_{ref} - 1)p}(x - \bar{x})^T S^{-1}(x - \bar{x})$$

where x=vector of measured values, $\bar{x}$=vector of reference means (based on history), and S-1 is the inverse covariance matrix (based on history), nref is the size of the reference sample, nnew is the size of the new sample and p is the number of variables. This function obeys an F statistic, F(p, nref-p,alpha). Where alpha is the probability corresponding to a desired false call rate (presuming the distributions of the individual parameters are normal).

Another related technique for reducing a two-dimensional dataset to a surrogate variable is known as principal component analysis (PCA) which is incorporated by Jackson (J. Edward Jackson, *A User's Guide to Principal Components,* John Wiley & Sons, Inc. (1991) M. J. R. Healy, *Matrices for Statistics,* Oxford Science Publications (1986)), incorporated herein by reference. In this method, the eigenvectors of the covariance matrix (or alternately the eigenvectors of the correlation matrix) form a set of independent intermediate variables, consisting of linear combinations of the original process variables. These principal components may be monitored separately, by taking only the most significant or by monitoring the residuals. Alternatively, the principal components may be monitored in aggregate, in which case the sum of squares distance of a particular sample from its principal components is identical to the Hotelling $T^2$ surrogate variable.

One difficulty with multivariate methods is that, once an out-of-control situation is detected, determining which process variables caused the problem is difficult, based on a single or few indicator variables. This is often known as the $T^2$ decomposition problem. Doganaksoy, above, provides a method to solve the decomposition problem, that orders the process variables in order of descending normalized difference from their means, i.e., $(x_i - \bar{x}_i)/\sigma_i$, the univariate statistic.

Runger (G. C. Runger, F. B. Alt, "Contributors to a multivariate statistical Process control chart signal," *Commun. Statist.—Theory Meth.* 25(10) 2203–2213 (1996)), incorporated herein by reference, provides another such method by considering the change in the $T^2$ score if the process parameter is not included (the "drop 1" $T^2$ score, $a^Di$).

However, the conventional systems are not adequately able to distinguish between variations that do not affect products and variations that do affect products. The invention solves this and other problems of the conventional systems, as discussed below.

SUMMARY OF THE INVENTION

It is, therefore, an object of the present invention to provide a structure and method for controlling a manufacturing tool, including measuring different manufacturing parameters of the tool, transforming a plurality of time series of the manufacturing parameters into intermediate variables based on restrictions and historical reference statistics, generating a surrogate variable based on the intermediate variables, if the surrogate variable exceeds a predetermined limit, identifying a first intermediate variable, of the intermediate variables, that caused the surrogate variable to exceed the predetermined limit and identifying a first manufacturing parameter associated with the first intermediate variable, and inhibiting further operation of the tool until the first manufacturing parameter has been modified to bring the surrogate value within the predetermined limit.

The surrogate variable comprises $T^2$, where:

$$T^2 = \left(\frac{(x-\bar{x})}{\sigma}\right)^T R^{-1} \left(\frac{(x-\bar{x})}{\sigma}\right) = z^T R^{-1} z,$$

where x comprises the intermediate variables, $\bar{x}$ comprises a historical sensor value, $\sigma$ comprises a historical standard deviation sensor value, $R^{-1}$ comprises an inverse correlation matrix, z comprises mean and standard deviation normalized values. Further, x and $\sigma$ are user-adjustable which provides a substantial advantage over conventional systems.

The transforming reduces the dimensionality of the time series of the manufacturing parameters. Also, the transforming includes one or more of selecting, modifying and combining the time series of the manufacturing parameters based on the restrictions and the historical reference statistics. Further, the data may be pre-processed to normalize all of the incoming time series. The restrictions comprise user-defined, batch-specific restrictions.

Another embodiment of the invention is a computer implemented method of controlling a tool using multivariate analysis that includes measuring a set of tool variables with sensors, storing values of the variables in a computer connected to receive data from the sensors (the computer generating a surrogate variable having a value representative of whether the tool is in control, the surrogate variable being a function of a plurality of intermediate variables), determining if the value of the surrogate variable is outside of a predetermined limit (the computer identifying an out-of-control intermediate variable of the intermediate variables that primarily contributed to the value of the surrogate variable), identifying an out-of-control tool variable of the tool variables that primarily contributed to the out-of-control intermediate variable, and inhibiting further operation of the tool until the out-of-control tool variable has been modified to bring the surrogate value within the predetermined limit.

The inventive method also includes inputting reference statistics and a transformation program into the computer; inputting raw data from process runs into the computer; using the transformation program to compute the intermediate variables from the raw data; and applying the reference statistics to a scaled version of a Hotelling function and computing the $T^2$ score for the surrogate variable based on the intermediate variables.

A further embodiment of the invention is a computerized method of determining corrections for a manufacturing process that includes measuring a set of manufacturing parameters, performing a first $T^2$ score computation using the manufacturing parameters, providing a first inverse matrix using intermediate variables obtained from the first $T^2$ score computation, using the first inverse matrix to create a generalized formulation for such matrices, using the generalized formulation to compute a second $T^2$ score for the inverse matrix with one variable missing, and subtracting the second $T^2$ score from the first $T^2$ score. The invention also includes repeating the computing and the subtracting for each of the intermediate variables; and ranking results of the subtracting to identify an out-of-control intermediate variable.

The invention also includes a computer interface for creating a file for transformation of various process recipes, process tools and products in a statistical analysis of a manufacturing process. The computer interface includes an input device for inputting data, a correction device for correcting missing data in a time series of the data by determining a length of the times series and an interpolation interval of the time series, a first selector for selecting a transformation function, a generator for generating one or more control charts from a Hotelling function using the data corrected by the correction device and using the transformation function, and a second selector for selecting between the control charts. The Hotelling function comprises $T^2$, where:

$$T^2 = \left(\frac{(x-\bar{x})}{\sigma}\right)^T R^{-1} \left(\frac{(x-\bar{x})}{\sigma}\right) = z^T R^{-1} z,$$

where x comprises the intermediate variables, $\bar{x}$ comprises a historical sensor value, $\sigma$ comprises a historical standard deviation sensor value, $R^{-1}$ comprises an inverse correlation matrix and z comprises mean and standard deviation normalized values. Further, the transformation function reduces a dimensionality of the time series of the manufacturing parameters. The transformation function selects, modifies and combines the time series of the manufacturing parameters based on restrictions and historical reference statistics, where the restrictions comprise user-defined, batch-specific restrictions.

Thus, the invention collapses the three-dimensional dataset to two-dimensions in an automated way, while still providing a convenient means to include human expertise. Once this two-dimensional dataset is determined, more conventional multivariate reduction methods such as Hotelling $T^2$ and PCA can be used further to reduce data to a few surrogate variables.

To incorporate human expertise, the invention includes a human configurable transformation programming language that selects a set of process variable time series, performs vector-to-vector operations (to produce a new set of time series), and performs vector-to-scalar operations on the new time series to obtain a one-dimensional set of scalar "intermediate" variables for each item processed.

The inventive system determines if a parameter shift will put products at risk based on historical reference data and codified human expertise. When a significant change occurs, the system identifies the tool, the most likely parameters, and suggests corrective action. The invention inhibits use of the tool until corrective action is taken. The invention also monitors process recipes for changes, authorized or unauthorized.

Further, the present invention provides a practical method for multivariate tool fault detection that prevents wafer mis-processing. The invention uses human expertise to distinguish which variations can be tolerated and which are of interest.

BRIEF DESCRIPTION OF THE DRAWINGS

These and other objects, aspects and advantages will be better understood from the following detailed description of a preferred embodiment of the invention with reference to the drawings, in which:

FIG. 10 is an example of a transformation program; and

DETAILED DESCRIPTION OF PREFERRED EMBODIMENTS OF THE INVENTION

The inventive system determines if a parameter shift will put products at risk based on historical reference data and codified human expertise. When a significant change occurs, the system identifies the tool, the most likely out-of-control parameters, and suggests corrective action. The invention inhibits use of the tool until corrective action is taken. The invention also monitors process recipes for changes, authorized or unauthorized.

Further, the present invention provides a practical method for multivariate tool fault detection that prevents wafer mis-processing. As mentioned above, conventional methods and systems are not adequately able to distinguish between variations that do not affect products and variations that do affect products. The invention uses human expertise to distinguish which variations can be tolerated and which are of interest.

For example, some parameters change over long periods and are reset after a maintenance activity such as chamber cleaning, but these changes have no product quality consequence. Secondly, many methods have been suggested (such as those discussed above) to reduce three-dimensional datasets to a few surrogate variables, but none provide a method to enter human expertise into the automated fault detection process as the invention does.

To find which process variables are out of control (given that a certain surrogate variable is out of control), the invention includes a convenient method to find the drop 1 $T^2$ score. Additionally, the invention can be combined with a factory logistics system to provide a tool fault detection system.

Figure 1:
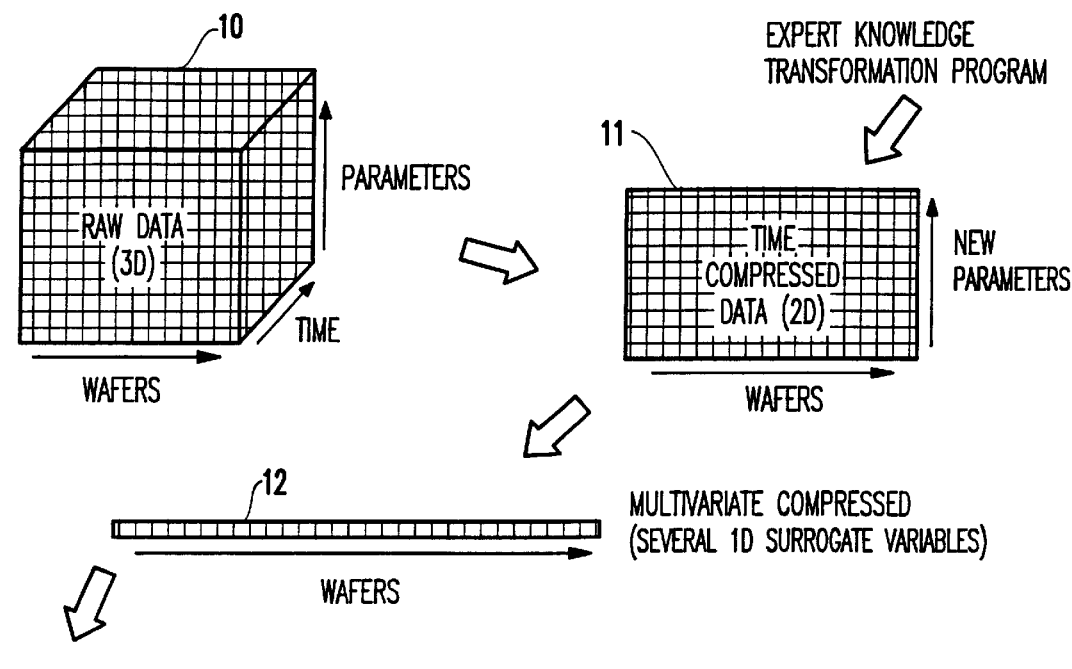
FIG. 1 is a schematic diagram of a data reduction strategy.

Referring now to the drawings, FIG. 1 illustrates the overall strategy of the invention that reduces the three-dimensional dataset into a few "health" tool indicators or surrogate variables. The raw data 10 includes data points along three axes: time, process variable and wafer. To reduce this matrix from three to two-dimensions, the time axis is eliminated.

Many mathematical functions can be applied to one or more time series (for each process variable for a given wafer) which transform the time series into another time series (e.g., vector-to-vector transformation). Some examples of such functions might be the point by point sum of two time series, or a high pass filter applied to a single time series. Mathematical functions also transform vectors into scalars. Some examples of these are mean, standard deviation, maximum, and sum.

Figure 9:
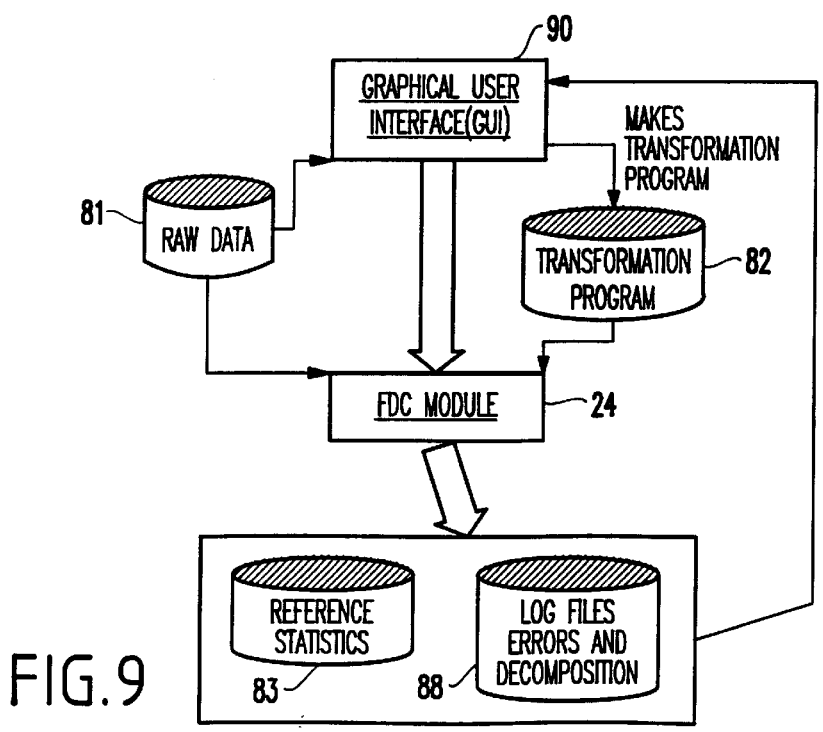
FIG. 9 is a schematic diagram of pre-production usage.

To incorporate human expertise (as shown in item 11 in FIG. 1), the invention includes a configurable transformation programming language (described in greater detail below with respect to FIGS. 9 and 10) which selects a set of process variable time series; performs vector-to-vector operations (to produce a new set of time series); and performs vector-to-scalar operations on the new time series to obtain a one-dimensional set of scalar "intermediate" variables for each item (e.g., wafer) processed. While some of the conventional systems reduce the dimensionality from three-dimensions to two-dimensions, none of the conventional systems reduce the dimensionality of the data set using intermediate variables in the manner that the invention does. Therefore, the invention produces a two-dimensional dataset, item 11 in FIG. 1.

A Hotelling $T^2$ statistic or other multivariate technique (such as those discussed above, e.g., PCA) can be applied to the two-dimensional dataset 11 to obtain a single "health of the tool" index for each item processed 12 (a one-dimensional dataset). Therefore, contrary to conventional systems, the invention has multidimensional reduction (e.g., three-dimensions 10 to one-dimension 12), which simplifies processing. For example, the invention applies the Hotelling $T^2$ statistic to selected groups of the intermediate variables to obtain several "health of the tool" statistics that have a particular meaning, given the expert knowledge transformation program. The Hotelling $T^2$ statistic is then used in conjunction with the factory control system as follows.

Figure 2:
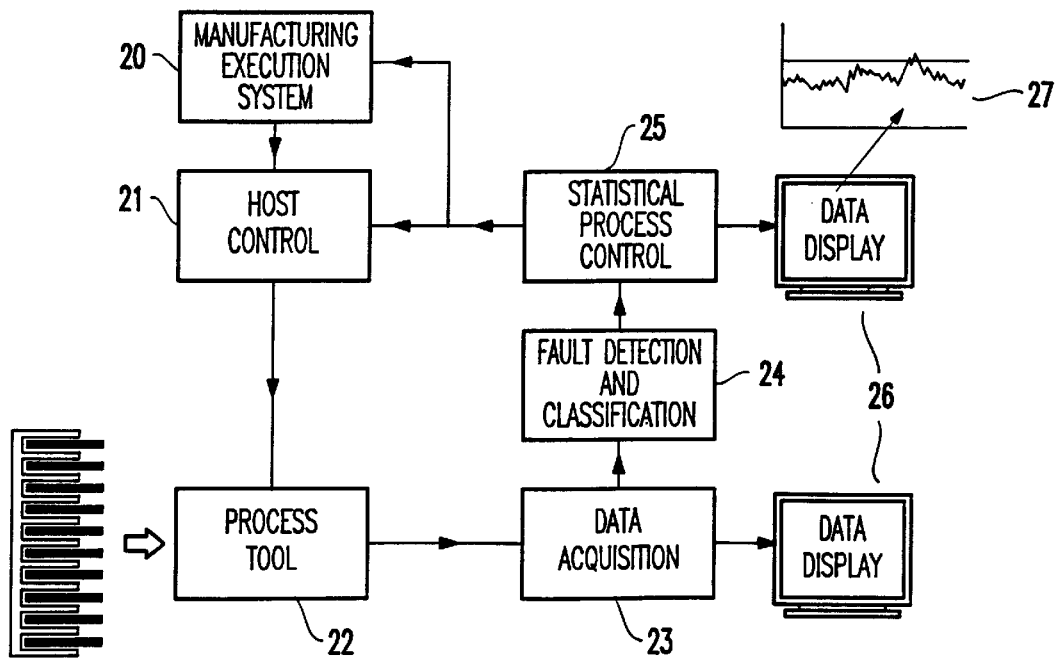
FIG. 2 is a flow diagram illustrating a floor control system.

FIG. 2 is a schematic diagram of major functional modules of an exemplary system. While a specific manufacturing system is described below, as would be known by one ordinarily skilled in the art given this disclosure, the invention is equally applicable to any manufacturing or processing system. Further, in the following illustrations, the same conceptual processes are represented by the same numbering throughout the figures for consistency and to aid in understanding.

As shown in FIG. 2, a manufacturing execution system (MES) 20 supplies logistic information to a host control system 21. The host control system 21 controls the activity of individual process tools 22. The data acquisition (DA) system 23 collects the data from the tools 22 and sends the data to the fault detection & classification (FDC) system 24. The FDC 24 calculates the "health of the tool" surrogate variables based on the data reduction scheme described above, and sends them to the statistical process control (SPC) system 25, which then reports malfunctions to the host control system 21 and the manufacturing execution system 20, completing the control loop. The data can be displayed on a monitor 26 in, for example, a bar graph 27.

Figure 3:
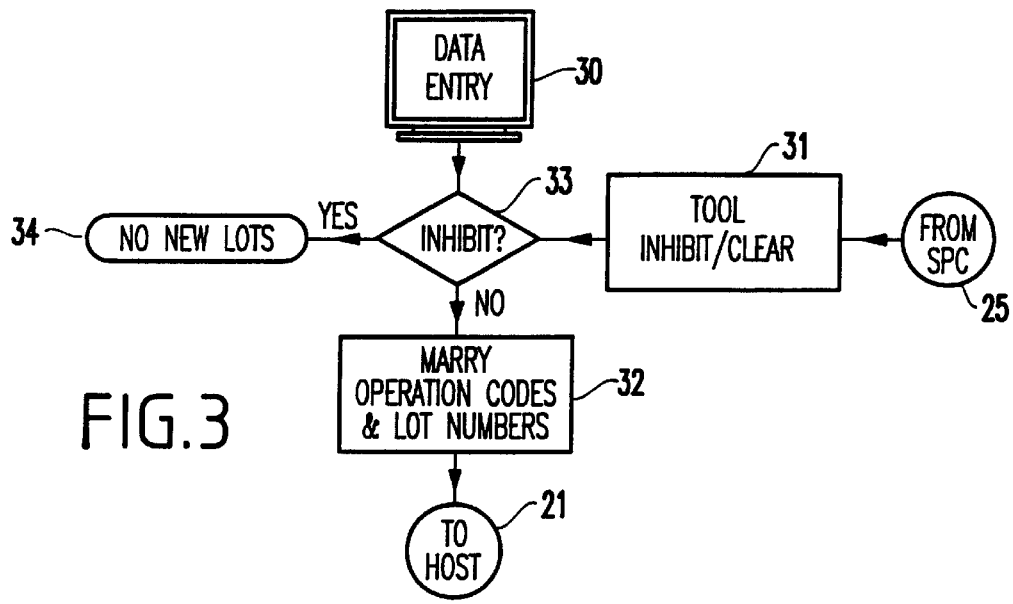
FIG. 3 is a flow diagram illustrating a manufacturing execution system.

FIG. 3 illustrates the functions of the manufacturing execution system 20 in greater detail. A query for the next lot is input as data entry 30. If there is no inhibit against the operation codes 31 (e.g., the tool is clear and operational and there is no indication from the SPC system 25 of a tool problem), the lot number is assigned operation codes 32 and the logistic information is transmitted to the host 21. If there is an inhibit from the operation code (e.g., the tool is not clear) then there are no new lots processed 34.

Figure 4:
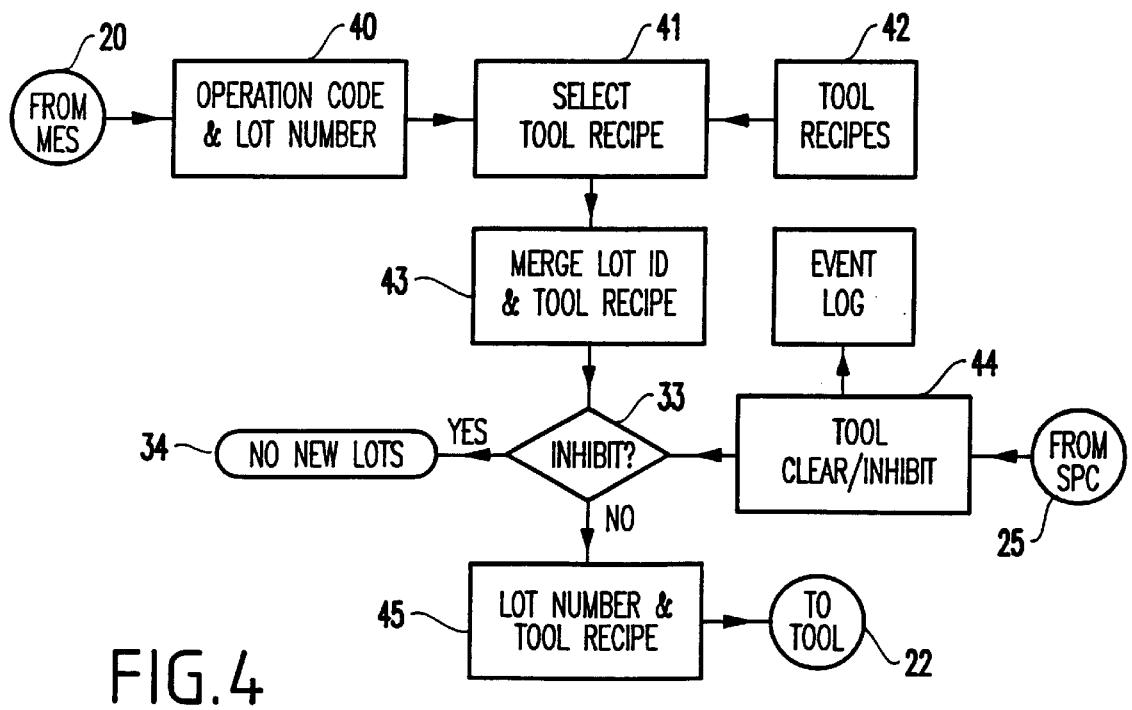
FIG. 4 is a flow diagram illustrating a host control.

FIG. 4 shows the operation of the host system 21 in greater detail. First the operation code 40 from the MES 20 is used to select a process recipe 41 from the tool recipes 42. The lot ID and tool recipe are merged in item 43. If the tool 44 is clear (e.g., there is no inhibit against the tool 44 from the SPC system 25) the lot identification and recipe 45 are transmitted to the process tool 22. If the tool 44 is not clear, then there are no new lots processed 34.

Figure 5:
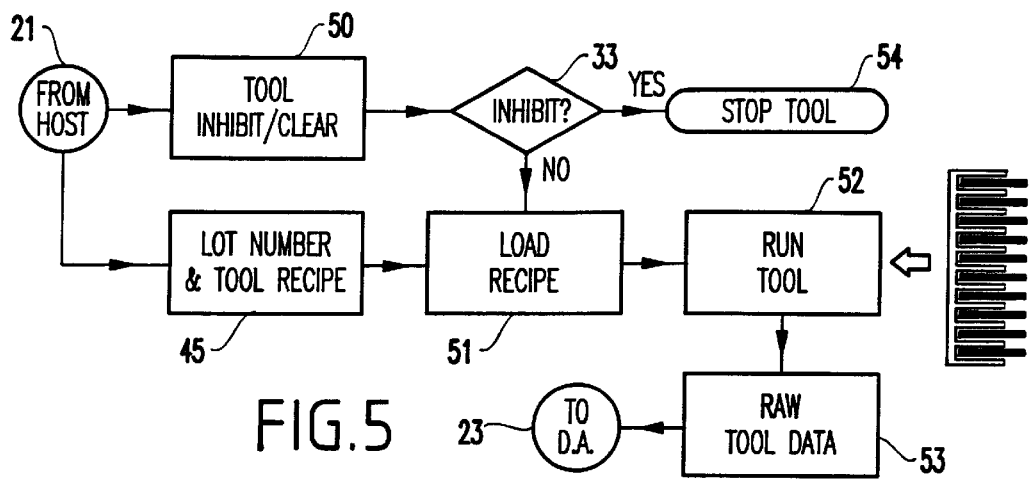
FIG. 5 is a flow diagram illustrating a process tool.

In FIG. 5 the functions that occur at the process tool 22 are shown in greater detail. The tool inhibit/clear 50 and lot number and tool recipe 45 are loaded from the host 21. As shown in item 51, if there is no inhibit 33 the recipe is passed to the tool 52 to run. Data 53 is collected on the lot (e.g., pressure, temperature and gas flow) and is passed to the data acquisition system 23. If there is an inhibit 33 the tool is stopped 54.

Figures 6, 7:
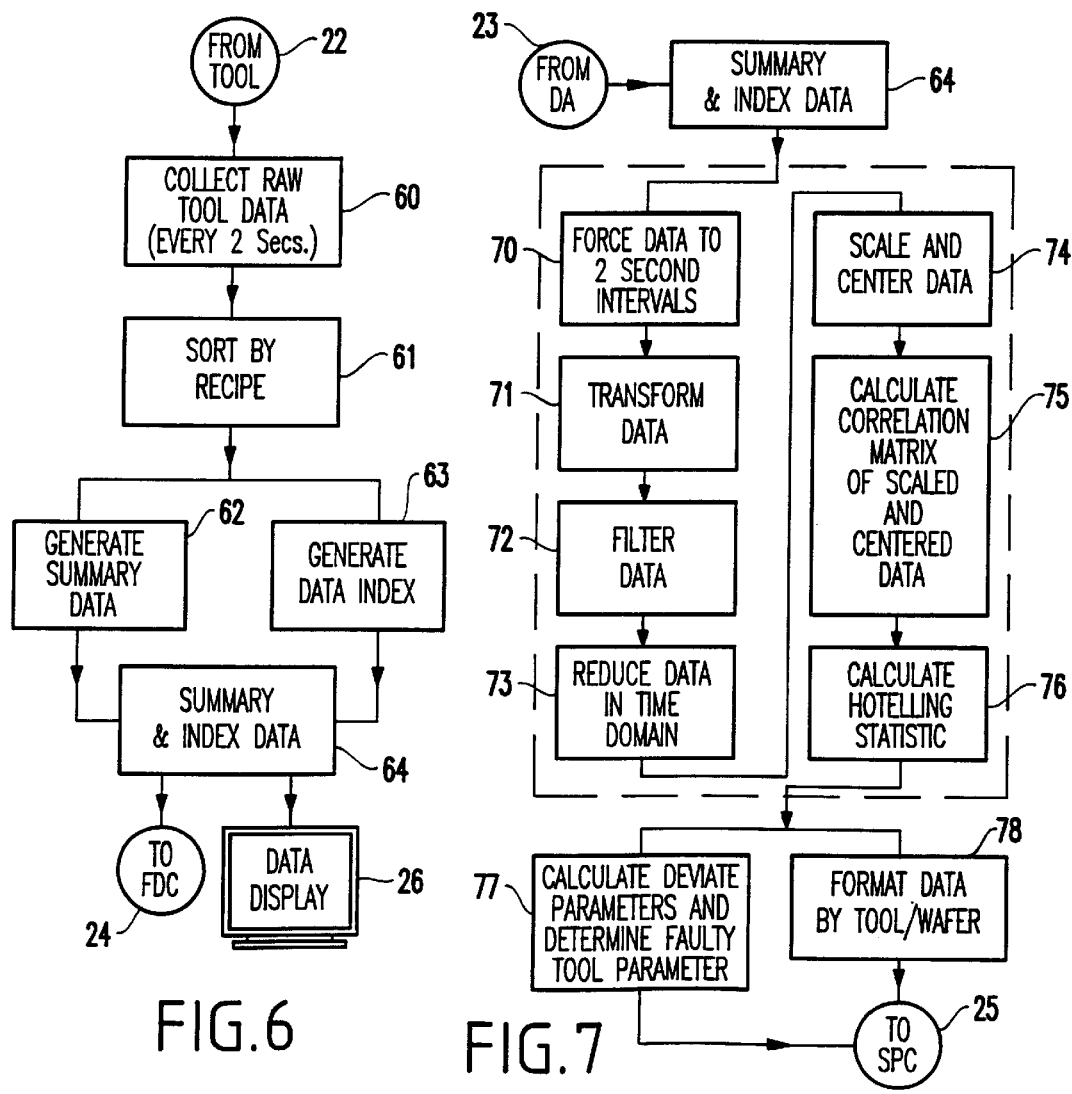
FIG. 6 is a flow diagram illustrating data acquisition.
FIG. 7 is a flow diagram illustrating fault detection and classification.

The data acquisition 23 is shown in greater detail in FIG. 6. The raw tool data 60 from the tool 22 (which could be sampled periodically, e.g., every two seconds) is sorted by recipe 61. This process generates summary data 62 and a data index 63. The summary and index data are compiled 64 so that lots and ultimately individual production items (e.g., wafers) may be identified by the fault detection and classification module 24. The summary and index data 64 can also be transferred to the data display 26.

FIG. 7 illustrates the fault detection and classification module 24 in greater detail. The summary and index data 64 comes from the data acquisition 23 where it is sampled at various times 70 (e.g., 2 second intervals). The data is then transformed 71 as discussed below with respect to FIGS. 8–10, and filtered 72. The data are typically transformed first and then filtered. For example, particle count data is usually distributed log-normal. Thus, the data would first be transformed to a normal distribution and then filtered, with say a high-pass filter, to provide a meaningful input.

After filtration the data is reduced in the time domain 73. Once the data are transformed and filtered (as a time series, so a vector remains) they are then collapsed in the time domain using, for example, a vector to scalar operation such as mean, max or Sum $(ABS(x^2))$.

Then, the data is scaled and centered 74 and a correlation matrix is calculated 75. Correlation matrix is calculated from data which have already been centered and scaled mean=0 std=1. The correlation value can be represented as follows:

$$CORR = \frac{\sum ((x_i - \bar{x}_i)^2 (y_i - \bar{y}_i)^2)}{\sigma_{x_i}^2 \sigma_{y_i}^2}$$

The Hotelling statistic is also calculated 76 to reduce the vectors to a scalar.

The parameters of the tool that deviate from predetermined constraints are calculated to find the faulty tool parameter 77 and this information is supplied to the statistical process control 25.

The data format (by tool/wafer) 78 is also supplied to the statistical process control 25. Thus, as shown in FIG. 7, (and in more detail in FIG. 11, below) the fault detection and classification module 24 determines if and where tool related faults are occurring, and determines possible causes. More specifically, the $T^2$ score (a tool health indicator) is formulated, as discussed below with respect to FIG. 8, and compared with predetermined limits, as discussed below with respect to FIG. 11.

Figure 8:
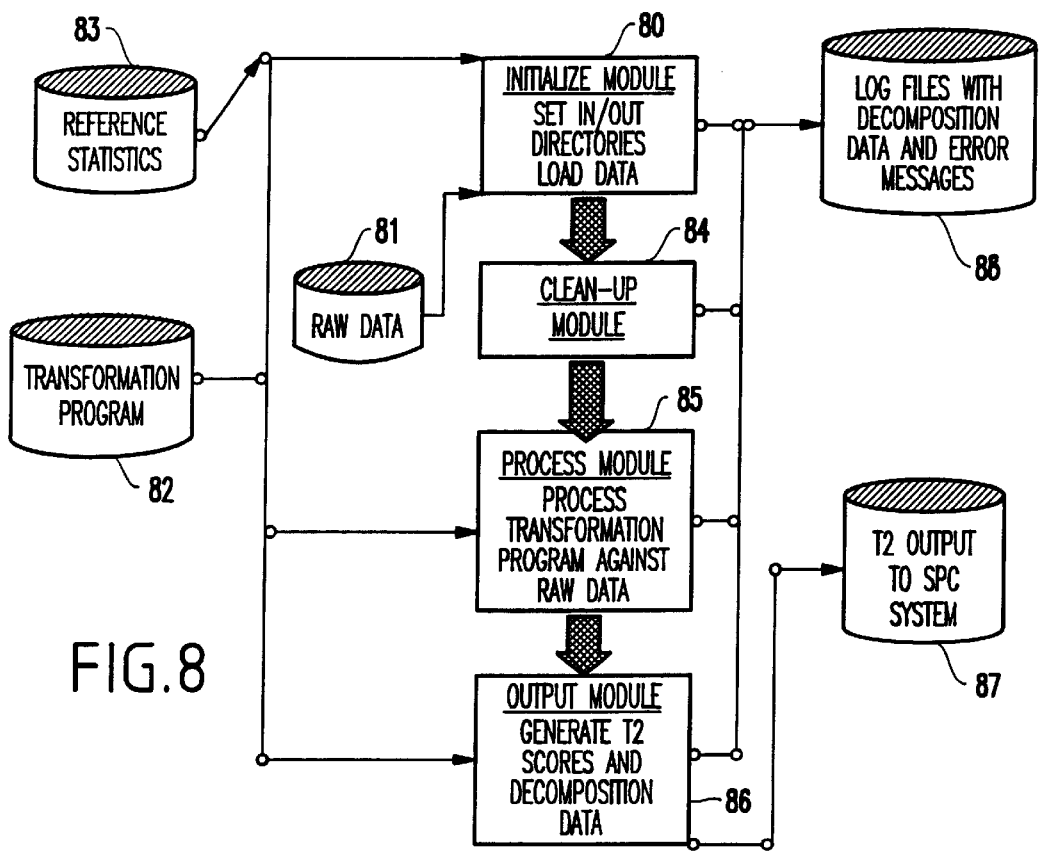
FIG. 8 is a schematic diagram of an FDC module program flow.

FIG. 8 illustrates the processing used to calculate the $T^2$ score. Each time an item is processed by a tool, the raw data 81 (e.g., a time series of a large set of process parameters) is input to an initialized module that has directories (in/out) which have been set, as shown in item 80. In addition, a predetermined time series transformation program 82 and reference statistics 83 are also input. The invention includes a unique transformation program 82 and reference statistics 83 for each product recipe (e.g., there may be distinct recipes for different products and technologies run on a given manufacturing tool), as discussed in greater detail below with respect to FIGS. 9 and 10.

The raw data 81 is cleaned up as shown in item 84. More specifically, the data is "cleaned up" by interpolating the data to exact time intervals, filling in data gaps of short time duration and performing checks on data integrity (such as minimum vector length). Therefore, the clean-up module determines if data is missing in a time series by observing the length of the times series and the regular interval of the time series. The invention then corrects (e.g., interpolates) the missing values, if the gap is within a predetermined limit. If the gap in the time series exceeds the limit, the data series is considered defective and is rejected.

The transformation program 85 is then run using the cleaned up data set (e.g., the process variable time series). Thus, as specified in the transformation program, specific time series are chosen, modified and possibly combined with other time series and then reduced to a set of intermediate variables (as specified in the transformation program.).

The $T^2$ score (e.g., the surrogate value) 86 is computed for the set of intermediate variables using the reference statistics (described below). Rather than the conventional $T^2$ equation, a scaled version is used (see Jackson, supra, where a similar method is applied to PCA computations). More specifically, the modified Hotelling Statistic is:

$$T^2 = \left(\frac{(x-\bar{x})}{\sigma}\right)^T R^{-1} \left(\frac{(x-\bar{x})}{\sigma}\right) = z^T R^{-1} z$$

where x=vector of measured values, $\bar{x}$=vector of reference data means (based on history), σ=reference data standard deviations (based on history) and R−1 is the inverse correlation matrix and z is the mean and standard deviation normalized values.

The formula, $$\left(\frac{(x-\bar{x})}{\sigma}\right)$$

indicates that the division is to be performed vector-element by vector-element.

This formula for the Hotelling $T^2$ statistic is useful in that the correlation matrix and the standard deviations can by treated separately rather than combined into a single covariance matrix. For example, there are cases where the reference data set may have one parameter with zero standard deviation (e.g. a digital readout of a very constant gas flow can produce this situation). In this case, or to increase or decrease sensitivity to a particular intermediate variable, when one assumes or insures that this variable is uncorrelated to any others, the user may insert an engineering derived standard deviation in place of the computed statistical standard deviation, while avoiding the need to recompute the inverse correlation matrix since this remains unchanged.

Finally, log files with decomposition data and error messages 88 are received from the initialize module 80, clean up module 84, process module 85 and output module 86.

The $T^2$ score is then reported to the statistical process control system 25 for use in inhibiting the tool as shown in item 87. The tool is inhibited whenever the $T^2$ score exceeds a predetermined limit. This limit can be computed from the desired probability of false calls using an appropriate statistical distribution such as an F distribution. Also, the $T^2$ values maybe normalized by a "limit" corresponding to the aforementioned F distribution at a given false call rate. Then, an out of control data point is one which exceeds 1, with 0 being perfect control.

In addition, the parameters most likely to have deviated from normal operation are computed by the invention. These are determined for a given set of scalar reductions of time series by providing two different orders for which an intermediate variable is most likely deviated. The first order is a descending series indicating which intermediate variable is furthest from its historical mean (e.g., normalized by standard deviations—Doganksoy, supra). The second order is determined by eliminating one intermediate variable from the $T^2$ score computation and determining the difference from the original $T^2$ score (e.g., by dropping 1 score from the method of Runger, supra). These intermediate variables are then put in descending order. The dropping of 1 score can be conveniently computed with the invention using the following formula (which is sometimes referred to herein as a "generalized formulation"):

$$D_k = T^2 - T^2_{kremoved} = \left[\sum_i (R_{ki}^{-1} z_i)\right]^2 / R_{kk}^{-1}$$

Where R is the correlation matrix, and z=

$$z = \left(\frac{(x - \bar{x})}{\sigma}\right),$$

the normalized measurements. The above formula is derived by considering the computation of an inverse matrix with one element missing from an original inverse matrix (a generalized formula for this is found in Healy, supra). When the dropping of 1 correlation matrix is found, the $T^2$ score can be computed and subtracted from the original $T^2$ score, thus obtaining the above simplified inventive formula.

Placing the intermediate values is a specific order (or removing one of the $T^2$ scores) identifies which surrogate variable is out of control and, therefore, identifies the most likely out-of-control parameters. For example, if an $HT^2$ (Hotelling $T^2$) value is 100 and the dropping of one parameter (e.g., parameter (i)) reduces the $HT^2$ (which is then defined as $HT^2(-i)$) to 10 then the invention calculates that parameter (i) contributed 90% of total $HT^2$ value. Therefore, by individually removing each parameter and ranking the modified $HT^2$ values in reverse order, the most likely contributors to the $HT^2$ value can be identified.

The invention also uses multiple $T^2$ scores (health of tool surrogate variables) to indicate problems with specific portions or aspects of the tool. One disadvantage of combining too many intermediate variables into a single surrogate variable is that sensitivity to any individual variable changing is reduced. To avoid this, in some cases, the invention uses several sets of intermediate variables, on each of which are performed $T^2$ computations, thus obtaining more than one surrogate variable. This is a particularly useful aspect when the different sets of intermediate variables are not expected to be correlated. For example, the invention can consider all parameters that are related to the RF power system in a plasma etch chamber for one index and all parameters related to the gas flow and pressure in another index using the above system.

As mentioned above, the transformation program 82 and reference statistic 83 information must be generated for each product recipe prior to running the inventive system in production. This process is shown in more detail in FIG. 9 and is identified as the pre-production process flow.

In, for example, an off-line system, a graphical user interface program 90 obtains the raw data 81 files for many units (e.g., wafers) which have already been produced (historical data). Using expertise (human knowledge) a user selects the process parameter time series of interest, the vector-to-vector mathematical functions to be used, the vector-to-scalar functions to be used and the groupings of scalar functions that are to be made to allow the invention (e.g., transformation functions) to create the transformation program 82 as discussed in greater detail below with respect to FIG. 10.

As would be known by one ordinarily skilled in the art, given this disclosure, the graphical user interface could comprise any commonly known interface which allows users to input information. For example, the graphical user interface could comprise a series of questions, could be an icon-driven interface which displays groups to be selected by the user and may provide points of input for the user to specify answers to various questions, or could simply require a specific higher level programming language input format.

For example, the user may specify that the means of several gas flow time series are to be monitored and combined into a single index (using $T^2$), while a high pass filter is to be applied to the RF power and tuning blade time series. The invention then takes the standard deviation, and the intermediate variables are grouped into another index. With the invention, the user also has additional control over whether a $T^2$ computation is performed on the set of scalars or whether another methodology (e.g., the Bonferonni method, Johnson, supra) is used to determine whether the set of intermediate variables is within prescribed limits.

With the invention, the development of the specific set of transformation procedures 82 can proceed iteratively. The procedures are run against historical data to determine whether the sensitivity to known problems is adequate. Thus, the graphical user interface (GUI) 90 allows a convenient means of determining these procedures, running them against historical data and examining the results.

Once a procedure has been established, it is run against an initial larger historical dataset to produce the initial appropriate reference statistics (correlation matrix, inverse correlation matrix, intermediate variable means, standard deviations, statistical limits to the $T^2$, or other multivariate calculations). The initial historical dataset is then cleaned up to remove outliners and other aberrant data and the transformation procedures are run on the revised dataset to establish the reference statistics 83. In addition, the transformation procedure can be modified during this process to further refine the reference statistics 83.

This statistical data file 83, along with the transformation program 82, are output and are used as inputs to the manufacturing line. The transformation program, which is run automatically against the appropriate product during production, contains the human expertise (previously incorporated through the graphical user interface 90) needed to monitor those changes known to be important, while the invention ignores or reduces the sensitivity to changes known to be irrelevant to production issues.

An example of a transformation program is illustrated in FIG. 10. The example shows how the information is coded for the production program. More specifically, first parameters are specified (using the GUI 90, as described above) for the data cleanup module 84, the maximum allowable gap in the time series, minimum and maximum time series lengths and the exact interval to be interpolated are input. The false call rate is also specified.

Next, the transformation procedure is specified (again, using the GUI 90). As would be known by one ordinarily skilled in the art given this disclosure, the information needed for the transformation procedure can be directly input by the user according to any number of higher level programming languages or the information needed to create the transformation procedure may be obtained from the user through a series of questions, icon selections, etc., the answers to which would then be automatically converted to a syntactically correct programming language.

For example, as shown in FIG. 10, the RF_power for chamber A is read in ("load") and assigned to a program variable, v0. Next the "mean" is computed, a column name specified (A_RF_POWER_mean) and a multivariate procedure specified (Hotelling $T^2$ method) and a multivariate chart name specified (Chart1). A high pass filter ("vphfilter") is applied to the RF_power (vector-to-vector function), assigned to program variable v1, and then the standard deviation ("stddev") is taken for this new time series. Similar types of operations are applied to N2_flow and C12_flow. This set of scalar intermediate variables is specified and put in a particular multivariate control chart (Chart1), using a particular procedure (Hotelling $T^2$). As would be known by one ordinarily skilled in the art given this disclosure, the invention can include different control charts for different intermediate variables, each with their own multivariate procedures.

Once the pre-production process (e.g, FIG. 9) has been run, the manufacturing line application can be started. More specifically, data is sent onto the statistical process control system 25 and is $T^2$ plotted using the process discussed above with respect to FIG. 8.

Figure 11:
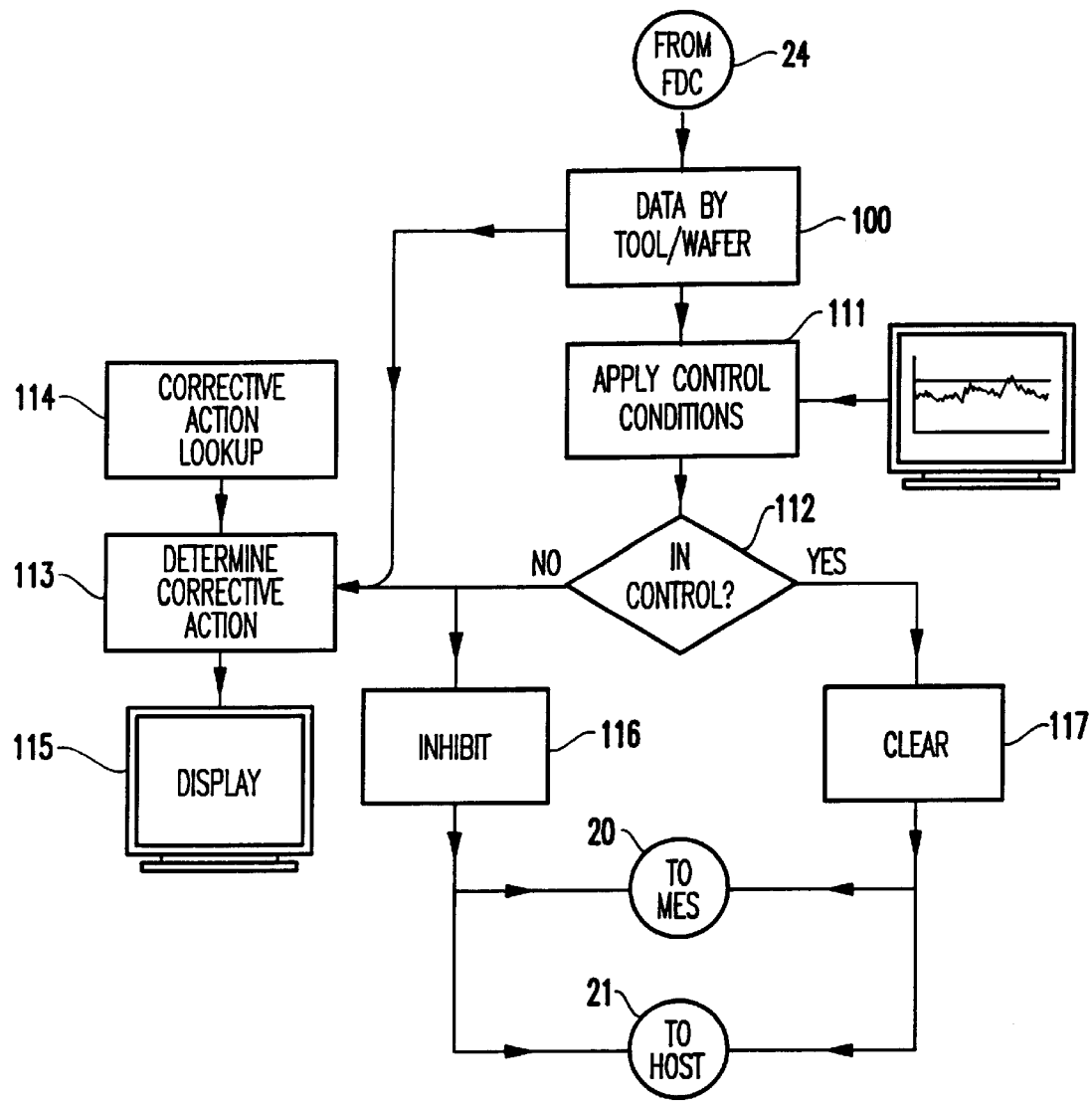
FIG. 11 is a flow diagram of statistical process control.

FIG. 11 illustrates, in greater detail, how the statistical process control system 25 determines if a tool is in or out of control. More specifically, the data by tool or wafer is input from the FDC 24, as shown in item 100, control conditions (e.g., predetermined limits) are then applied to the data in item 111 and, in item 112, a determination is made as to whether the data exceeds any of the control conditions and is out of control.

If it is not in control, a corrective action 114 is looked up and then determined 113 depending upon the data from item 100. The corrective action is suggested to the user (e.g., displayed 115) or automatically implemented. The lookup table 114 can compare parameter fails to probable tool faults based on tool/process/monitor wafer/measurement history and human expertise.

Also, if a tool is in control, a clear signal 117 is produced. To the contrary, if a tool is not in control, it is inhibited 116. The clear 117 or inhibit 116 signal is forwarded to the manufacturing execution system 20 or to the host 21.

With the invention, the operator has the opportunity to override the normalization, points and standard deviations. This may be necessary if an adjustment to one processing parameter causes another process parameter's normal running point to shift. For example, with correlated parameters changing σ can cause $HT^2$ to go out of control falsely. Changing them all equally keeps $HT^2$ in "balance".

Therefore, the invention determines if and where tool related faults are occurring, and determines possible causes based on historical reference data and codified human expertise. As shown above, the invention collapses the three-dimensional dataset to two-dimensions in an automated way, while still providing a convenient means to include human expertise. Once this two-dimensional dataset is determined, more conventional multivariate reduction methods such as Hotelling $T^2$ and PCA can be used to further reduce data to a few surrogate variables.

As also discussed above, to incorporate human expertise, the invention includes a human configurable transformation programming language that selects a set of process variable time series, performs vector-to-vector operations (to produce a new set of time series), and performs vector-to-scalar operations on the new time series to obtain a one-dimensional set of scalar "intermediate" variables for each item processed.

Further, as mentioned above, the inventive system determines if a parameter shift will put products at risk based on historical reference data and codified human expertise. When a significant change occurs, the system identifies the tool, the most likely parameters, and suggests corrective action. The invention inhibits use of the tool until corrective action is taken. The invention also monitors process recipes for changes, authorized or unauthorized.

Thus, the present invention provides a practical method for multivariate tool fault detection that prevents wafer mis-processing and uses human expertise to distinguish which variations can be tolerated and which are of interest.

While the invention has been described in terms of preferred embodiments, those skilled in the art will recognize that the invention can be practiced with modification within the spirit and scope of the appended claims.

What is claimed is:

1. A computerized method of determining corrections for a manufacturing process, comprising:

measuring a set of manufacturing parameters;

performing a first $T^2$ score computation using said manufacturing parameters;

providing a first inverse matrix using intermediate variables obtained from said first $T^2$ score computation;

using said first inverse matrix to create a generalized formulation for such matrices;

using said generalized formulation to compute a second $T^2$ score for said inverse matrix with one variable missing; and subtracting said second $T^2$ score from said first $T^2$ score.

2. The method according to claim 1, wherein:

$$T^2 = \left(\frac{(x-\bar{x})}{\sigma}\right)^T R^{-1}\left(\frac{(x-\bar{x})}{\sigma}\right) = z^T R^{-1} z,$$

where x comprises said intermediate variables, $\bar{x}$ comprises a historical sensor value, σ comprises a historical standard deviation sensor value, $R^{-1}$ comprises an inverse correlation matrix and z comprises mean and standard deviation normalized values.

3. The method according to claim 2, wherein x and σ are user adjustable.

4. The method in claim 1, further comprising transforming a plurality of time series of said manufacturing parameters into said intermediate variables based on restrictions and historical reference statistics.

5. The method according to claim 1, further comprising:

repeating said computing and said subtracting for each of said intermediate variables; and ranking results of said subtracting to identify an out-of-control intermediate variable.

6. The method in claim 5, wherein said ranking determines which missing variable causes a largest difference between said first $T^2$ score and said second $T^2$ score.

7. The method in claim 6, wherein a missing variable causing said largest difference is an out-of-control intermediate variable.

8. A computerized method of determining corrections for a manufacturing process, comprising:

measuring a set of manufacturing parameters;

performing a first surrogate score computation using said manufacturing parameters;

providing a first inverse matrix using intermediate variables obtained from said first surrogate score computation;

using said first inverse matrix to create a generalized formulation for such matrices;

using said generalized formulation to compute a second surrogate score for said inverse matrix with one variable missing; and subtracting said second surrogate score from said first surrogate score.

9. The method according to claim 8, wherein said first surrogate score comprises:

$$T^2 = \left(\frac{(x-\bar{x})}{\sigma}\right)^T R^{-1} \left(\frac{(x-\bar{x})}{\sigma}\right) = z^T R^{-1} z,$$

where x comprises said intermediate variables, $\bar{x}$ comprises a historical sensor value, $\sigma$ comprises a historical standard deviation sensor value, $R^{-1}$ comprises an inverse correlation matrix and z comprises mean and standard deviation normalized values.

10. The method according to claim 9, wherein x and $\sigma$ are user adjustable.

11. The method in claim 8, further comprising transforming a plurality of time series of said manufacturing parameters into said intermediate variables based on restrictions and historical reference statistics.

12. The method according to claim 8, further comprising:

repeating said computing and said subtracting for each of said intermediate variables; and ranking results of said subtracting to identify an out-of-control intermediate variable.

13. The method in claim 12, wherein said ranking determines which missing variable causes a largest difference between said first surrogate score and said second surrogate score.

14. The method in claim 13, wherein a missing variable causing said largest difference is an out-of-control intermediate variable.

15. A computerized method of determining corrections for a manufacturing process, comprising:

measuring a set of manufacturing parameters;

performing a first $T^2$ score computation using said manufacturing parameters;

providing a first inverse matrix using intermediate variables obtained from said first $T^2$ score computation;

using said first inverse matrix to create a generalized formulation for such matrices;

using said generalized formulation to compute a second $T^2$ score for said inverse matrix with one variable missing;

subtracting said second $T^2$ score from said first $T^2$ score;

repeating said computing and said subtracting for each of said intermediate variables; and ranking results of said subtracting to identify an out-of-control intermediate variable.

16. The method according to claim 15, wherein:

$$T^2 = \left(\frac{(x-\bar{x})}{\sigma}\right)^T R^{-1} \left(\frac{(x-\bar{x})}{\sigma}\right) = z^T R^{-1} z,$$

where x comprises said intermediate variables, $\bar{x}$ comprises a historical sensor value, $\sigma$ comprises a historical standard deviation sensor value, $R^{-1}$ comprises an inverse correlation matrix and z comprises mean and standard deviation normalized values.

17. The method according to claim 16, wherein x and $\sigma$ are user adjustable.

18. The method in claim 15, further comprising transforming a plurality of time series of said manufacturing parameters into said intermediate variables based on restrictions and historical reference statistics.

19. The method in claim 18, wherein said ranking determines which missing variable causes a largest difference between said first $T^2$ score and said second $T^2$ score.

20. The method in claim 19, wherein a missing variable causing said largest difference is an out-of-control intermediate variable.

* * * * *